United States Patent
Liao et al.

(10) Patent No.: US 8,502,375 B2
(45) Date of Patent: Aug. 6, 2013

(54) CORRUGATED DIE EDGE FOR STACKED DIE SEMICONDUCTOR PACKAGE

(75) Inventors: Chih-Chin Liao, Changhua (TW); Cheeman Yu, Madison, WI (US)

(73) Assignee: SanDisk Technologies Inc., Plano, TX (US)

( * ) Notice: Subject to any disclaimer, the term of this patent is extended or adjusted under 35 U.S.C. 154(b) by 268 days.

(21) Appl. No.: 12/825,617

(22) Filed: Jun. 29, 2010

(65) Prior Publication Data
US 2011/0316164 A1    Dec. 29, 2011

(51) Int. Cl.
*H01L 23/34* (2006.01)

(52) U.S. Cl.
USPC ........... 257/724; 257/773; 257/777; 257/784; 257/E25.013; 257/E23.169; 257/E23.175; 257/E21.509; 438/107; 438/109

(58) Field of Classification Search
USPC .......... 257/686, 724, 773, 777, 784, E25.013, 257/E23.169, E23.175, E21.509; 438/107, 438/109
See application file for complete search history.

(56) References Cited

U.S. PATENT DOCUMENTS

| | | | |
|---|---|---|---|
| 6,621,155 B1 | 9/2003 | Perino et al. | |
| 6,750,545 B1 | 6/2004 | Lee et al. | |
| 6,803,656 B2 * | 10/2004 | Farnworth et al. | 257/730 |
| 6,855,572 B2 * | 2/2005 | Jeung et al. | 438/106 |
| 7,582,953 B2 | 9/2009 | Lin | |
| 7,615,853 B2 | 11/2009 | Shen et al. | |
| 2005/0067694 A1 | 3/2005 | Pon et al. | |
| 2007/0023763 A1 | 2/2007 | Takigawa et al. | |
| 2007/0218588 A1 | 9/2007 | Takiar et al. | |
| 2008/0054432 A1 * | 3/2008 | Corisis et al. | 257/686 |
| 2008/0150158 A1 | 6/2008 | Chin | |
| 2008/0174000 A1 | 7/2008 | Chen et al. | |
| 2009/0273096 A1 | 11/2009 | Hiew et al. | |

* cited by examiner

*Primary Examiner* — Tu-Tu Ho
(74) *Attorney, Agent, or Firm* — Vierra Magen Marcus LLP

(57) ABSTRACT

A semiconductor die and semiconductor package formed therefrom, and methods of fabricating the semiconductor die and package, are disclosed. The semiconductor die includes an edge formed with a plurality of corrugations defined by protrusions between recesses. Bond pads may be formed on the protrusions. The semiconductor die formed in this manner may be stacked in the semiconductor package in staggered pairs so that the die bond pads on the protrusions of a lower die are positioned in the recesses of the upper die.

34 Claims, 12 Drawing Sheets

*Fig. 4*
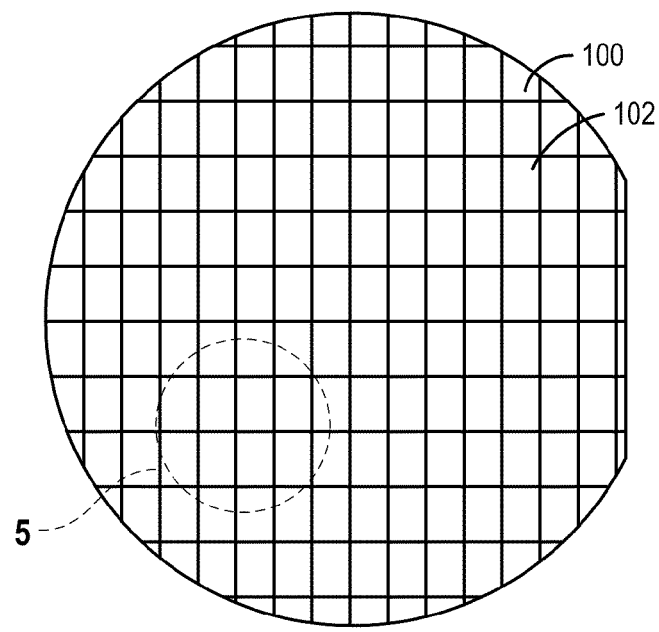
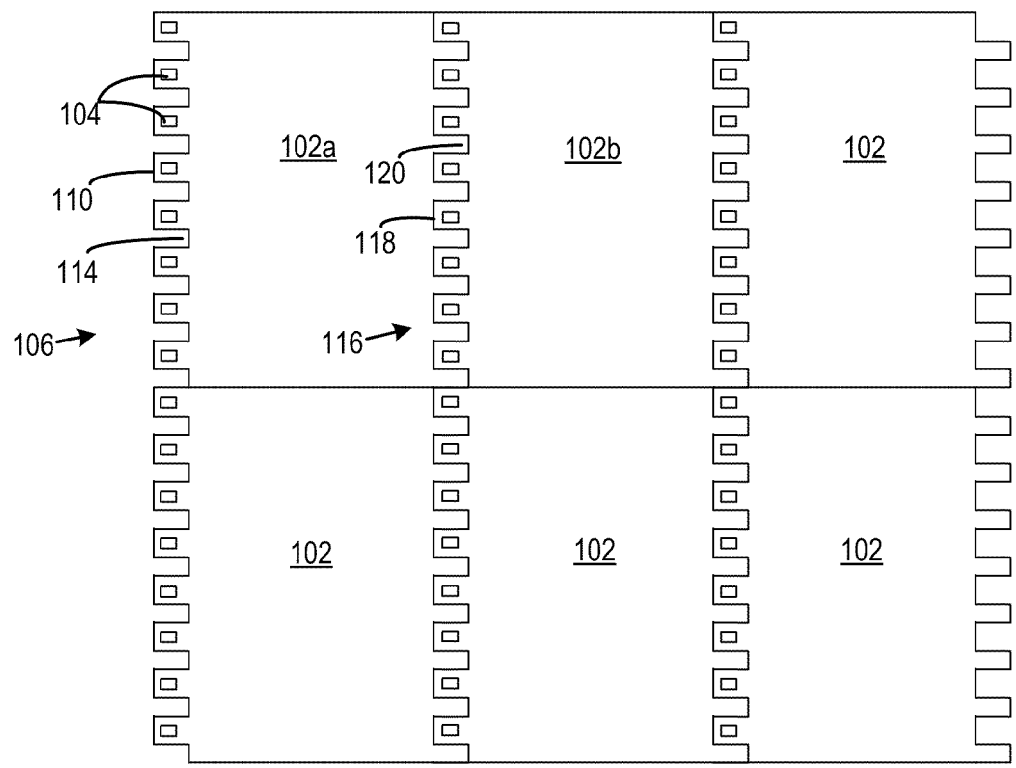
*Fig. 5*

CORRUGATED DIE EDGE FOR STACKED DIE SEMICONDUCTOR PACKAGE

BACKGROUND OF THE INVENTION

1. Field

The present technology relates to semiconductor packaging.

2. Description of Related Art

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

While a wide variety of packaging configurations are known, flash memory storage cards may in general be fabricated from so-called 3-D semiconductor devices, including for example a system-in-a-package (SiP) or multichip modules (MCM), where a plurality of die are mounted on a substrate in a stacked configuration. Edge views of conventional 3-D semiconductor packages 20 (without molding compound) are shown in prior art FIGS. 1 and 2. Typical packages include a plurality of semiconductor die 22 mounted to a substrate 26. In the examples shown, the die stack has four die, 22a, 22b, 22c and 22d. Further examples have more or less die in the stack. Although not shown in FIGS. 1 and 2, the semiconductor die 22 are formed with die bond pads on an upper surface of the die. Substrate 26 may be formed of an electrically insulating core sandwiched between upper and lower conductive layers. The upper and/or lower conductive layers may be etched to form conductance patterns including electrical leads and contact pads. Wire bonds 30 are soldered between the die bond pads of the semiconductor die 22 and the contact pads of the substrate 26 to electrically couple the semiconductor die to the substrate. The electrical leads on the substrate in turn provide an electrical path between the die and a host device. Once electrical connections between the die and substrate are made, the assembly is then typically encased in a molding compound to provide a protective package.

It is known to stack semiconductor die 22 on top of each other either with an offset configuration (prior art FIG. 1) or in an aligned configuration (prior art FIG. 2). In the offset configuration of FIG. 1, the die 22 are stacked with an offset so that the bond pads of the next lower die are left exposed. Such configurations are shown for example in U.S. Pat. No. 6,359,340 to Lin, et al., entitled, "Multichip Module Having a Stacked Chip Arrangement," which patent is incorporated herein by reference in its entirety. An offset configuration provides an advantage of convenient access to the bond pads on each of the semiconductor die. However, the offset requires a greater footprint on the substrate, where space is at a premium.

In the aligned configuration of prior art FIG. 2, the semiconductor die 22 are stacked directly on top of each other, thereby taking up less footprint on the substrate as compared to an offset configuration. However, in an aligned configuration, space must be provided between adjacent semiconductor die for the bond wires 30. In addition to the height of the bond wires 30 themselves, additional space must be left above the bond wires, as contact of the bond wires 30 of one die with the next die above may result in an electrical short. As shown in FIG. 2, it is therefore known to provide a dielectric spacer layer 34 to provide enough room for the bond wires 30 to be bonded between adjacent die 22. The requirement of the spacer layer adds height to the die stack and is a limiting factor in the number of die which may be included in the stack to still fit within the height of a standard memory card form factor.

Given the constant drive for greater storage capacity within a semiconductor package conforming to standard memory card form factors, there is a need for a new memory die packaging design.

DESCRIPTION OF THE DRAWINGS

FIG. 4 is a top view of a semiconductor wafer from which a plurality of semiconductor die according to embodiments of the present system may be fabricated.

FIG. 5 is an enlarged top view of a number of semiconductor die from the wafer of FIG. 4.

DETAILED DESCRIPTION

Embodiments will now be described with reference to FIGS. 3 through 24, which relate to a low profile semiconductor package. It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top," "bottom," "upper," "lower," "vertical" and/or "horizontal" are used herein for convenience and illustrative purposes only, and are not meant to limit the description of the invention inasmuch as the referenced item can be exchanged in position.

Figure 3:
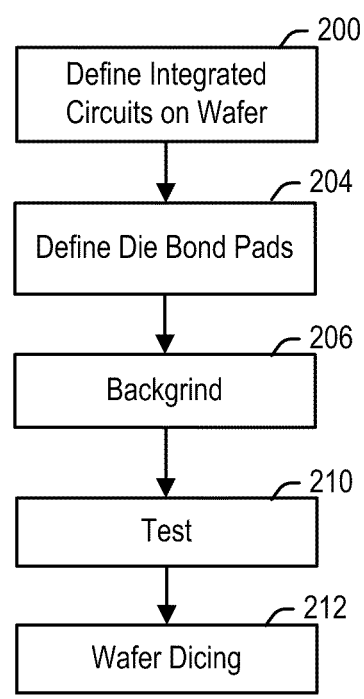
FIG. 3 is a flowchart for forming a semiconductor die according to embodiments of the present system.

A process for forming semiconductor die in accordance with the present invention will now be described with reference to the flowchart of FIG. 3, and the various top and perspective views of FIGS. 4 through 7. FIG. 4 shows a top view of a semiconductor wafer 100 for batch processing a plurality of semiconductor die 102 (one of which is labeled in FIG. 4). FIG. 5 shows a section of wafer 100 enlarged for greater clarity. The integrated circuit components of semiconductor die 102 may be formed on wafer 100 in step 200 by known processes such as film deposition, photolithography, patterning, and diffusion of impurities.

Die bond pads 104 may then be formed in respective die in step 204 by known processes including but not limited to plating, evaporation, screen printing, or various deposition processes. Bond pads 104 are used to electrically couple the semiconductor die 102 to another semiconductor die, or to a printed circuit board, leadframe or other substrate as explained hereinafter. It is understood that the number of bond pads 104 along an edge of the semiconductor die 102 may be more or less than is shown in the figures. Moreover, while the bond pads 104 are shown formed along a single, or first, edge, it is understood that the bond pads may be formed along additional edges as explained below.

In a step 206, a backgrind process may be performed on the back (inactive) surface of wafer 100 as is known in the art to thin the die 102 to the desired thickness. In step 210, the die 102 on wafer 100 may be tested for functional defects. Such tests include for example wafer final test, electronic die sort and circuit probe.

In step 212, each of the die 102 may be diced from the wafer. The dicing process may involve a first set of vertical cuts (from the perspective of FIGS. 4 and 5) along boundaries between adjacent die 102, and a second set of horizontal cuts (again from the perspective of FIGS. 4 and 5) along boundaries between adjacent die 102. The horizontal cuts may be done prior to the vertical cuts in alternative embodiments. In further embodiments, each die 102 may be cut individually from the wafer. That is, cuts are made around four sides of a die 102 to separate it from the wafer, then the next die is cut around four sides, etc.

In accordance with the present system, the vertical cuts may be made in a pattern of square teeth, referred to herein as corrugations, to form a plurality of protrusions and recesses on a die 102 on one side of a cut, and a plurality of corresponding recesses and protrusions on a die 102 on another side of the cut. In particular, as shown in FIG. 5, a die 102a may have an edge 106 cut with corrugations that define protrusions 110 and recesses 114. The die 102a includes a second edge 116 opposed to edge 106 cut with corrugations that define recesses 118 and protrusions 120. The recesses 118 and protrusions 120 on the second edge 116 of die 102a define the protrusions 110 and recesses 114 on an edge 106 on the next adjacent die 102b. The recesses 118 and protrusions 120 on die 102a and protrusions 110 and recesses 114 on die 102b may be formed during a single cutting operation.

In order to perform the dicing operation as described above, the wafer may be mounted on a dicing tape attached to a precision X-Y translating table (not shown). The corrugation cuts may then be made by a laser, such as for example an Nd:YAG laser. Other lasers are known for this process. In a further embodiment, it is also known to make detail wafer cuts using a laser microjet technology that incorporates a laser into a thin water jet. The laser or laser microjet may be applied to the wafer, and the wafer moved on the dicing tape in the X-Y plane to form the corrugations. The transverse cut (horizontal in FIGS. 4 and 5) may be made with the same laser or laser microjet as the corrugation cut. Alternatively, as the transverse cut is straight, the transverse cut may be made with a dicing saw.

Figure 6:
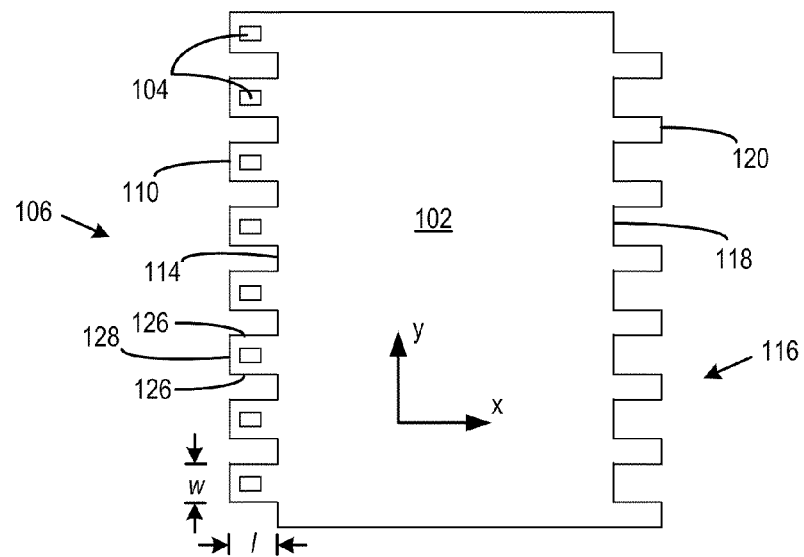
FIG. 6 is a top view of a semiconductor die according to the present technology.
Figure 7:
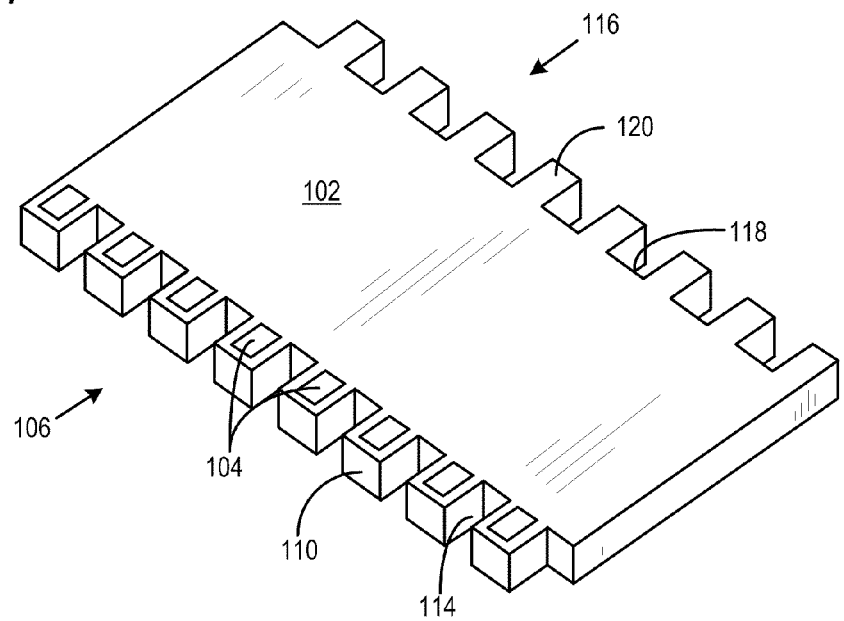
FIG. 7 is a perspective view of a semiconductor die according to the present technology.

FIGS. 6 and 7 show top and perspective views of a finished die 102 diced from wafer 100. As indicated above, the die 102 is cut with corrugations that define protrusions 110 and recesses 114 in edge 106, and recesses 118 and protrusions 120 in the opposed edge 116. The die bond pads 104 are also formed adjacent edge 106. The protrusions 110 are formed with a length, l, and width, w, so that each die bond pad 104 is positioned in a protrusion 110.

As shown on one of the protrusions 110 in FIG. 6, a protrusion 110 may be formed of three edges: two transverse edges 126 between a longitudinal edge 128. The transverse edges 126 may be parallel to each other and a major x axis of the die 102. Longitudinal edge 128 of a protrusion 110 may be orthogonal to the transverse edges 126 and parallel to a major y axis of the die 102. It is understood that the edges 126, 128 may have other inclinations in further embodiments. For example, transverse edges 126 may be inclined so that the edge 128 is broader or narrower than the dimension of protrusion 110 at a base of the protrusion. Moreover, while the corrugations are shown along a length dimension of the die 102, it is understood that the corrugations may alternatively or additionally be formed along the width dimension of the die 102 in further embodiments. In embodiments, the die 102 may be a memory die such as NAND flash memory die. However, die 102 may be other types of semiconductor die in further embodiments, such as for example NOR, DRAM and various other memory die.

A process for forming a semiconductor package in accordance with the present system using the semiconductor die 102 described above will now be explained with reference to the flowchart of FIG. 8, and the various views of FIGS. 9 through 24. Referring initially to the top and perspective views of FIGS. 9 and 10, a first semiconductor die 102a of a semiconductor die pair may be mounted on a substrate 130 in a step 220. The die 102a may be mounted to substrate 130 via a die attach adhesive in a known adhesive or eutectic die bond process.

Although not shown, substrate 130 may be part of a panel of substrates so that the semiconductor packages according to the present technology may be batch processed for economies of scale. Although fabrication of a single semiconductor package is described below, it is understood that the following description may apply to all packages formed on the substrate panel. The substrate 130 may be a variety of different chip carrier mediums, including a printed circuit board (PCB), a leadframe or a tape automated bonded (TAB) tape. Where substrate 130 is a PCB, the substrate may be formed of a core having top and/or bottom conductive layers formed thereon. The core may be various dielectric materials such as for example, polyimide laminates, epoxy resins including FR4 and FR5, bismaleimide triazine (BT), and the like.

The conductive layers may be formed of copper or copper alloys, plated copper or plated copper alloys, Alloy 42 (42FE/58NI), copper plated steel or other metals or materials known for use on substrates. The conductive layers may be etched into a conductance pattern as is known for communicating signals between the semiconductor die 102 and an external device (not shown). Substrate 130 may additionally include exposed metal portions forming contact pads 132 on an upper surface of the substrate 130. Where the semiconductor package is a land grid array (LGA) package, contact fingers (not shown) may also be defined on a lower surface of the substrate 130. The contact pads 132 and/or contact fingers may be plated with one or more gold layers, for example in an electroplating process as is known in the art.

In step 224, a second die 102b of the semiconductor die pair may be stacked on die 102a. As shown in the top, edge and perspective views of FIGS. 11 through 13, the die 102b may be affixed in a staggered orientation with respect to die 102a. That is, the die 102b may be aligned with the die 102a along the y-axis, but offset with respect to the x-axis. The die 102b may be staggered so that the recesses 114b of die 102b may be aligned over the die bond pads 104a in die 102a so that die bond pads 104a are not covered by die 102b.

In embodiments, die 102a and 102b may be identical to each other. In such embodiments, die 102b may be shifted one-half the distance (along the y-axis) between adjacent die bond pads 104 (center-to-center) to provide the staggered position. It is contemplated that die 102a and 102b need not have identical configurations. In such embodiments, die 102b would be shifted an amount relative to die 102a so that the die bond pads 104a in die 102a are exposed and accessible within recesses 114b of die 102b.

While the die 102b is shown staggered in the positive y direction (upward in FIG. 11) with respect to die 102a, it may be staggered in the negative y direction in further embodiments with the provision that the recesses 114b of die 102b be aligned over the die bond pads 104a in die 102a.

Figure 14:
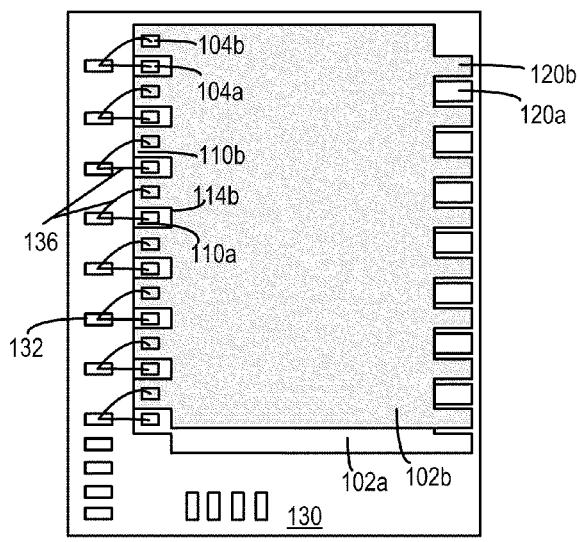
FIG. 14 is a top view of a semiconductor package during fabrication according to the present technology.
Figure 15:
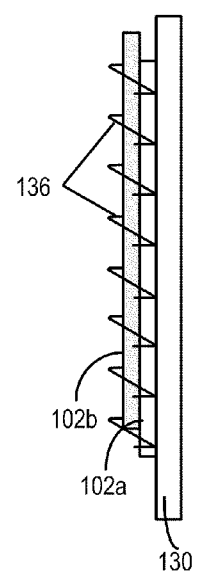
FIG. 15 is an edge view of a semiconductor package during fabrication according to the present technology.
Figure 16:
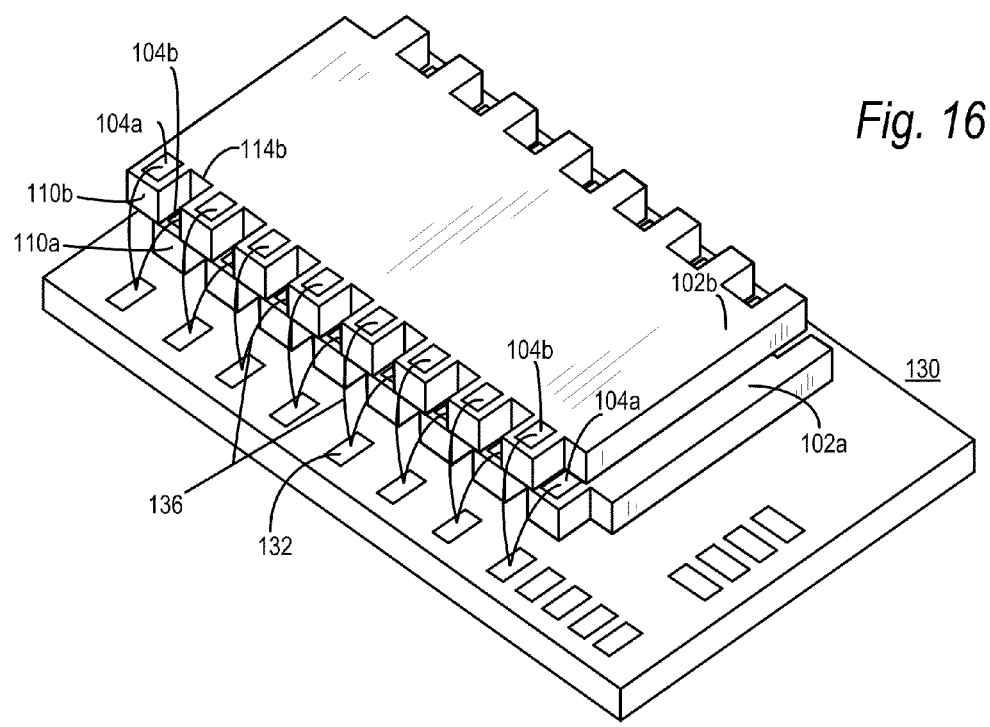
FIG. 16 is a perspective view of a semiconductor package during fabrication according to the present technology.

Referring now to the top, edge and perspective views of FIGS. 14 through 16, wire bonds 136 may be attached between die bond pads 104a on die 102a and contact pads 132 on substrate 130, and die bond pads 104b on die 102b and contact pads 132 on substrate 130, in a step 228. As the die bond pads 104a in die 102a are exposed within recesses 114b in die 102b, the wire bonds 136 may be affixed to bond pads 104a and then connected to contact pads 132, for example in a forward or reverse ball bonding process. The wire bonds 136 between bond pads 104b and contact pads 132 may also be made in a forward or reverse wire bond process. The wire bonds to bond pads 104b may be made either before the wire bonds to bond pads 104a, after the wire bonds to bond pads 104a, or intermittently with the wire bonds to bond pads 104a.

Figure 8:
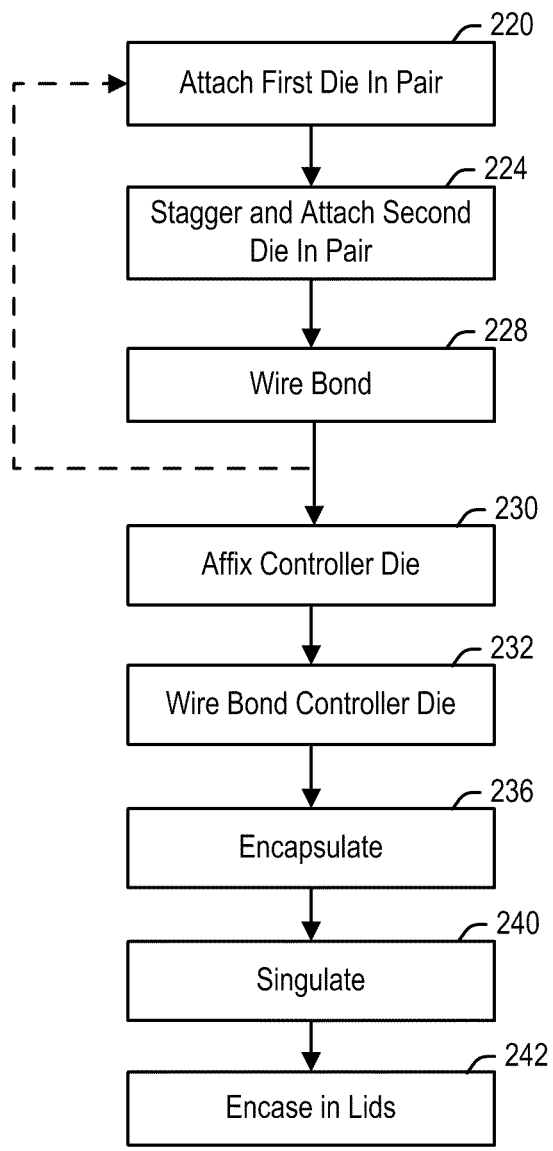
FIG. 8 is a flowchart showing the fabrication of a semiconductor device according to the present technology.
Figure 9:
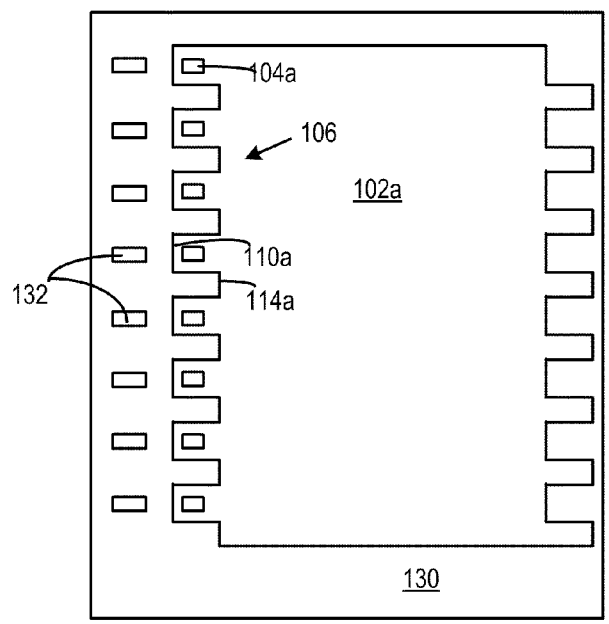
FIG. 9 is a top view of a semiconductor package during fabrication according to the present technology.
Figure 10:
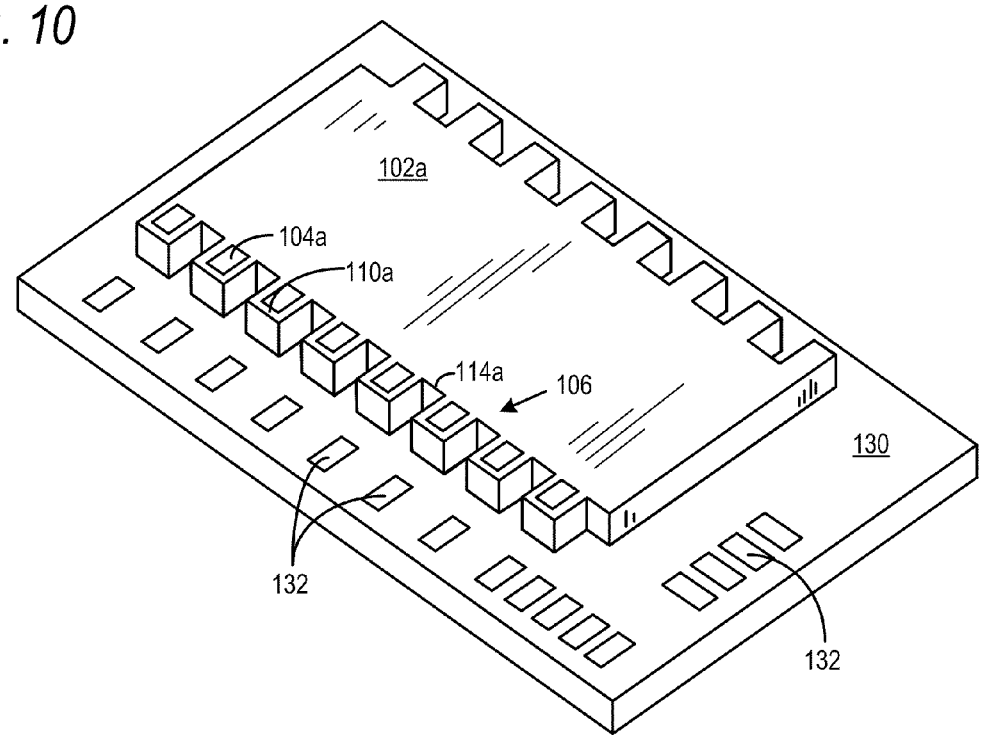
FIG. 10 is a perspective view of a semiconductor package during fabrication according to the present technology.
Figure 11:
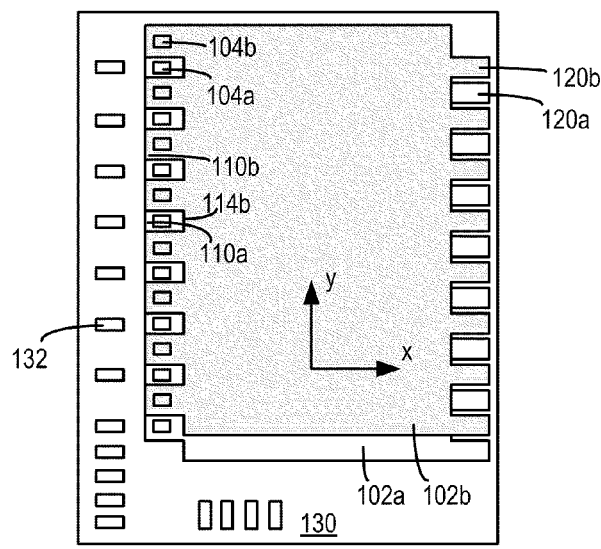
FIG. 11 is a top view of a semiconductor package during fabrication according to the present technology.
Figure 12:
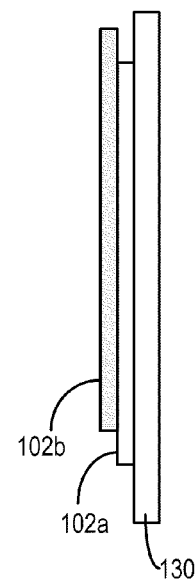
FIG. 12 is an edge view of a semiconductor package during fabrication according to the present technology.
Figure 13:
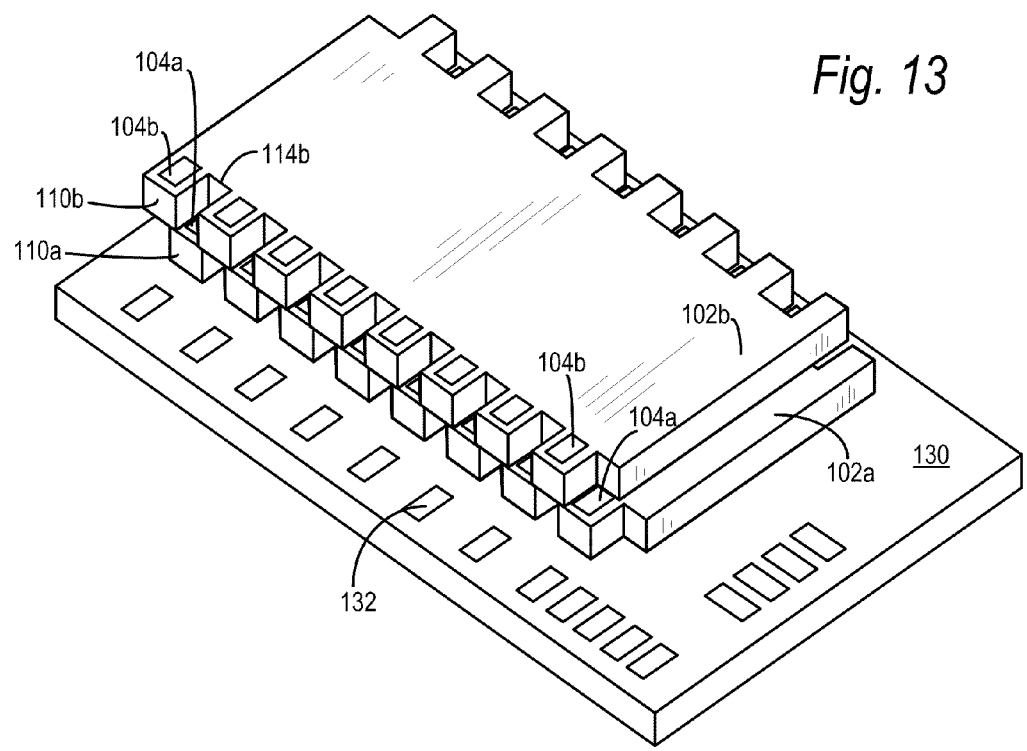
FIG. 13 is a perspective view of a semiconductor package during fabrication according to the present technology.

As indicated by the dashed arrow in the flowchart of FIG. 8, steps 220, 224 and 228 may be repeated to add additional die pairs on top of the die stack in the same manner that die 102a and 102b were mounted. In particular, in accordance with the present technology, the corrugations allow additional die pairs to be affixed directly atop the die 102a and 102b with no additional offset and without spacer layers between the die. Regardless of the number of additional die mounted on the die stack, the footprint of all die on the substrate may be the same footprint as die 102a and 102b together. Namely, the footprint may be the area of a die 102a, plus the offset of the die 102b from the die 102a along the y-axis.

Figure 1:
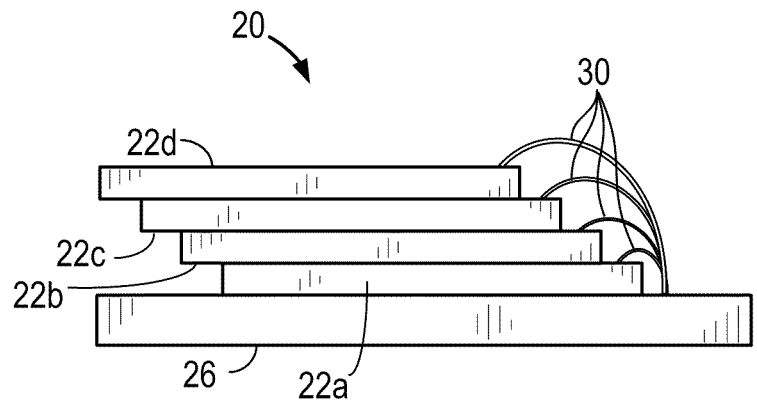
FIG. 1 is a prior art edge view of a conventional semiconductor device including semiconductor die stacked in an offset relation.
Figure 2:
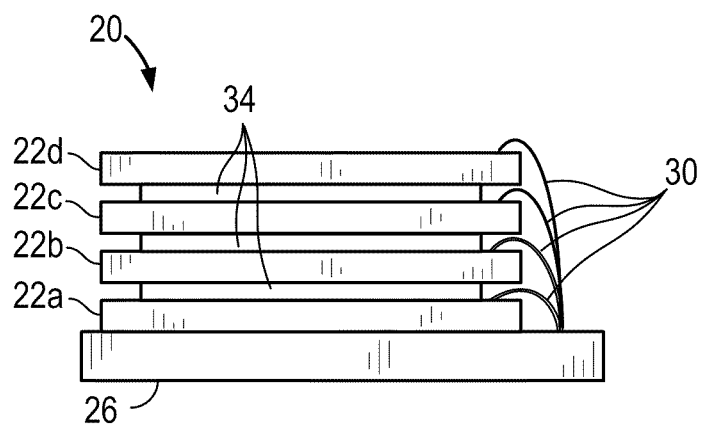
FIG. 2 is a prior art edge view of a conventional semiconductor device including semiconductor die stacked in an aligned relation and separated by spacer layers.

This offset for die stacks including two or more pairs of die is referred to herein as an alternating stacked offset. The footprint of the die attached with alternating stacked offset does not increase with additional die pair. This is in contrast for example to the offset die stack shown in prior art FIG. 1, where the addition of each offset die adds to the footprint of the die stack. In the present technology, the additional die pair(s) mount directly atop the die 102a and 102b so that all odd number die in the stack may align directly over die 102a, and all even number die in the stack may align directly over die 102b in the stack. In this way, the die bond pads 104 along edge 106 of a given die are always exposed within recesses 114 of the die mounted thereon. FIGS. 14 through 23 show a single pair of semiconductor die. An embodiment having an eight-die stack is explained with respect to FIG. 24 below.

In the example described above, the bottom semiconductor die in the stack, die 102a in the figures, is shown having corrugated edge 106. However, in further embodiments, the bottom die in the die stack need not have a corrugated edge.

Each additional die pair added to the stack may be added per steps 220, 224 and 228. The first die in the pair may be added staggered with respect to the die on which it is mounted. Thereafter, the second die in the pair may be affixed atop the first die in the pair in a staggered relation, and then the die pair wire bonded to the substrate 130. The flowchart of FIG. 8 indicates that semiconductor die are added in pairs. However, it is contemplated that a single die may be added to the die stack, and that the stack may have an odd number of die, in further embodiments.

The number of die 102 in the stack may be between one and eight, or greater than eight, in embodiments of the present technology. The corrugations and staggered relation of the die allow a large number of die in the stack while still fitting within a standard memory card form factor. Moreover, the die stack has a small footprint, which frees up valuable space on the substrate where space is at a premium.

Figure 17:
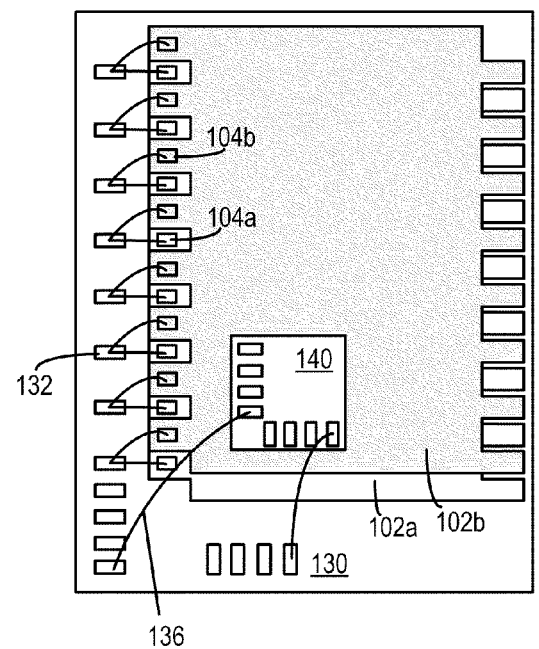
FIG. 17 is a top view of a semiconductor package during fabrication according to the present technology.
Figure 18:
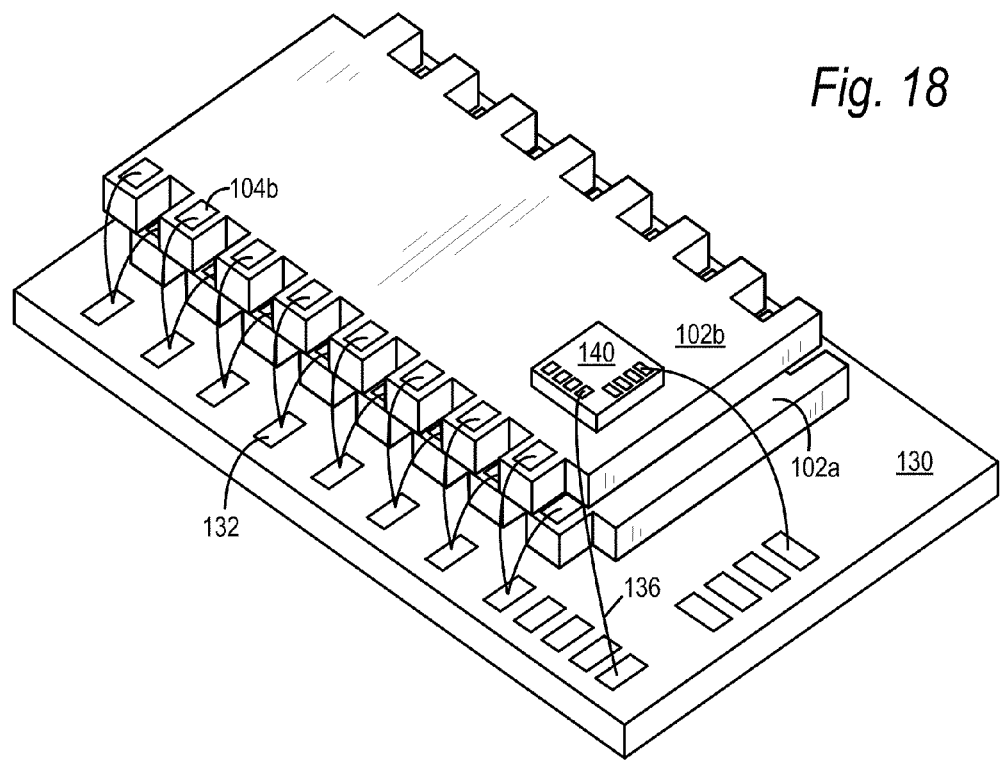
FIG. 18 is a perspective view of a semiconductor package during fabrication according to the present technology.
Figure 19:
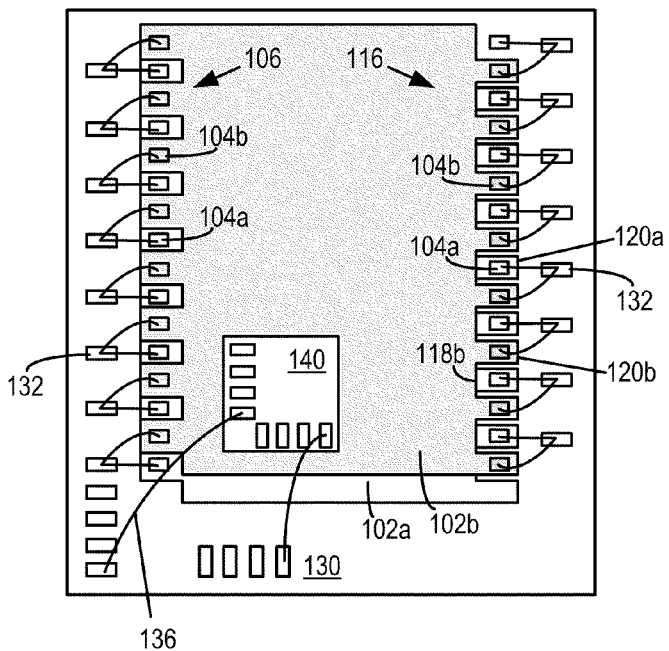
FIG. 19 is a top view of an alternative semiconductor package during fabrication according to the present technology.
Figure 20:
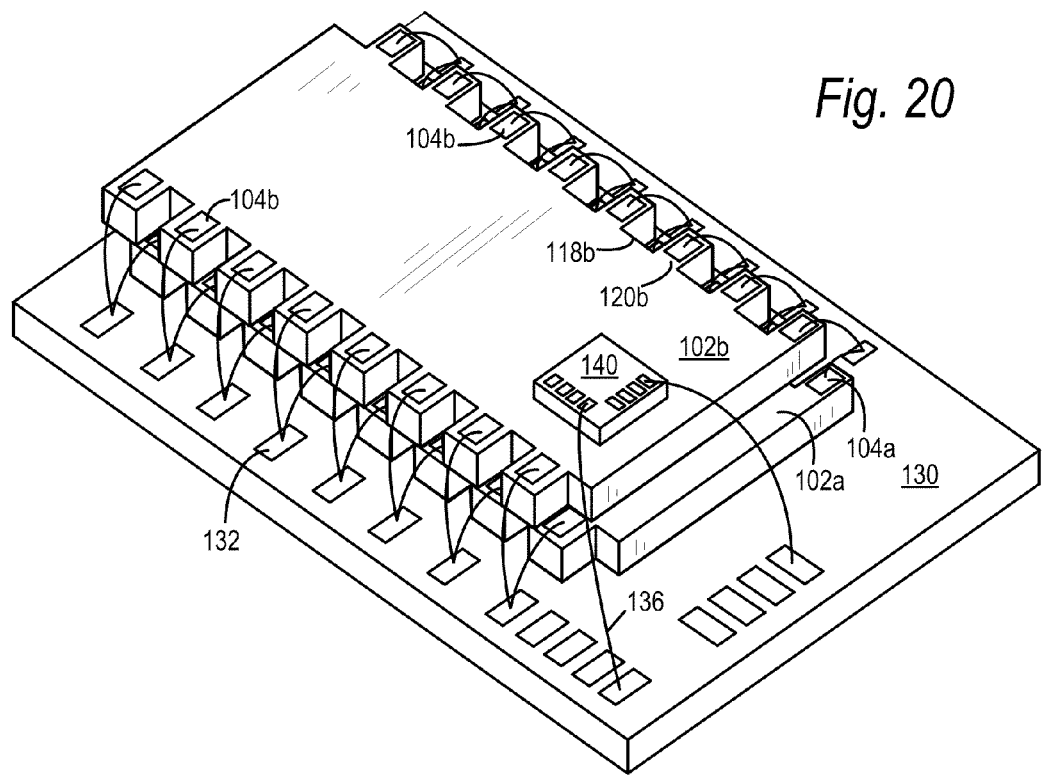
FIG. 20 is a perspective view of an alternative semiconductor package during fabrication according to the present technology.
Figure 21:
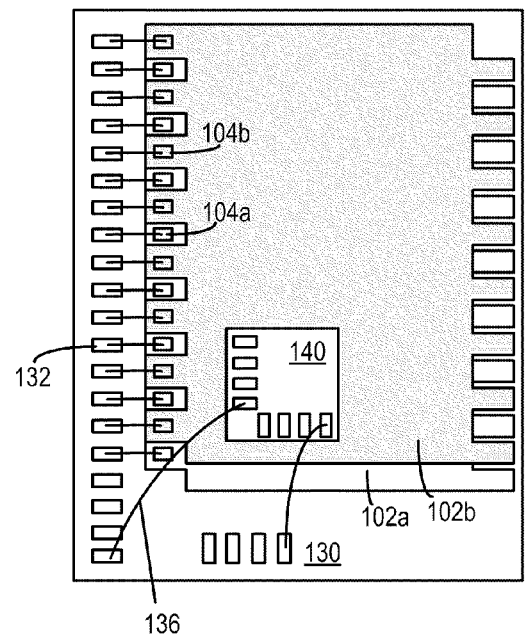
FIG. 21 is a top view of a further alternative semiconductor package during fabrication according to the present technology.
Figure 22:
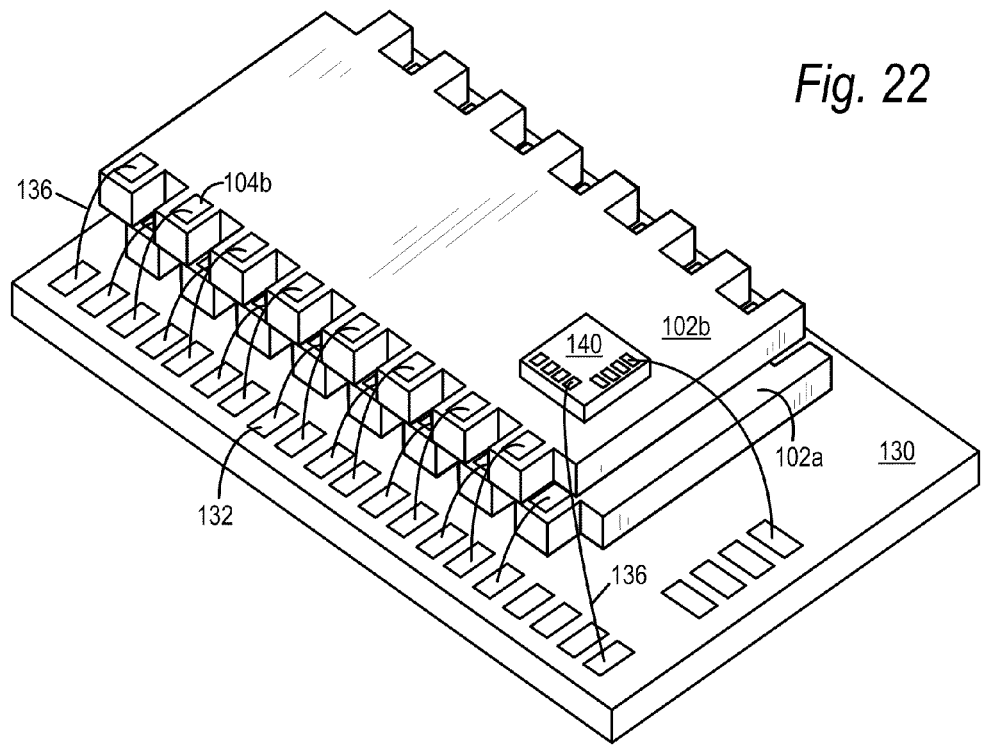
FIG. 22 is a perspective view of a further alternative semiconductor package during fabrication according to the present technology.

Referring now to the top and perspective views of FIGS. 17 and 18, once all die 102 have been provided in the die stack, a controller die 140 may be affixed atop the stack in step 230. Controller die 140 may for example be an ASIC, but may be other controller die in further embodiments. In step 232, the controller die 140 may be wire bonded to contact pads 132 on the substrate 130 (only some wire bonds are shown in FIGS. 17 and 18 for clarity). In the example shown, the controller die 140 may have die bond pads off two adjacent edges of the die, which are bonded to contact pads 132 on adjacent edges of the substrate 130. The controller die 140 may have die bond pads along a single edge or greater than two edges in further embodiments.

In the above-described embodiments, the wire bonds 136 may be uncoated gold, though they may alternatively be copper, aluminum or other metals. In a further embodiment of the present system, the wire bonds may be pre-insulated with polymeric insulation that makes the surface of the wire electrically non-conductive. Two examples of a pre-insulated wire bond which is suitable for use in the present system are disclosed in U.S. Pat. No. 5,396,104, entitled, "Resin Coated Bonding Wire, Method Of Manufacturing The Same, And Semiconductor Device," and U.S. Published Patent Application No. 2004/0124545, entitled, "High Density Integrated Circuits And The Method Of Packaging the Same," both of which are incorporated by reference herein in their entirety.

In the embodiments described above, the die 102 were formed with bond pads and corrugations along a single edge (edge 106). In a further embodiment, the bond pads 104 may also be formed in the protrusions 120 in the edge 116 of the die opposite edge 106. Such an embodiment is shown in the top and perspective views of FIGS. 19 and 20. In this embodiment, in addition to the connections made along edge 106 as described above, the edge 116 of die 102a may have bond pads 104a formed in protrusions 120a. Similarly, the edge 116 of die 102b may have bond pads 104b formed in protrusions 120b. As in the above-described embodiments, when the die 102b is mounted on die 102a, the bond pads 104a lie within recesses 118b between protrusions 120b. At that point, the bond pads 104a on die 102a and bond pads 104b on die 102b along edge 116 may be mounted to contact pads 132 on substrate 130 as described above.

In the embodiments described above, each contact pad 132 on the substrate 130 connects to a pair of die bond pads 104: a die bond pad 104a on die 102a and a die bond pad 104b on die 102b. In a further embodiment shown in the top and perspective views of FIGS. 21 and 22, each die bond pad 104a, 104b may wire bond to its own contact pad 132 on the substrate. In such an embodiment, there are as many contact pads 132 as there are die bond pads 104a plus die bond pads 104b. In further embodiments, some of the die bond pads 104a and 104b may connect together to a single contact pad 132, while the remaining die bond pads 104a and 104b each connect to their own contact pad 132 on the substrate 130. Additionally, the contact pads 132 in this embodiment are shown aligned in a single row. It is understood that the contact pads 132 in this and other embodiments may be provided on substrate 130 in two or more rows. Contact pads 132 may be provided on the substrate 130 along the edges 116 of the die 102a, 102b in accordance with this or other embodiments, and wire bonds 136 formed between the bond pads 104a, 104b along edge 116 and such contact pads 132.

Figure 23:
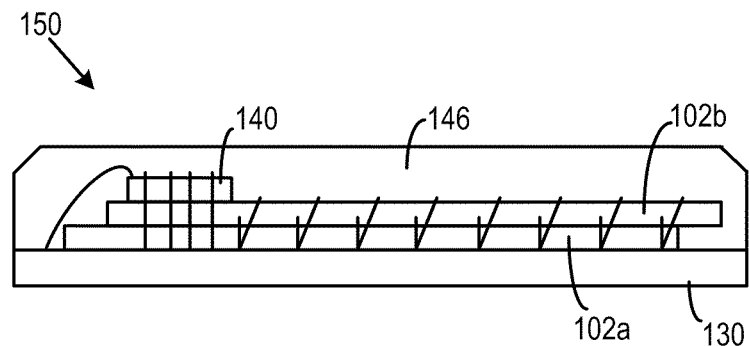
FIG. 23 is a cross-sectional view of a completed semiconductor device according to the present technology.

Referring now to the edge view of FIG. 23, after the die stack is formed and wire bonded to bond pads on the substrate 130, the die stack may be encased within the molding compound 146 in step 236. The encapsulated packages may then be singulated from the substrate panel in step 240, to form finished semiconductor die packages 150, one of which is shown in FIG. 23. Molding compound 146 may be a known epoxy resin such as for example available from Sumitomo Corp. and Nitto Denko Corp., both having headquarters in Japan. In some embodiments, the finished package 150 may optionally be enclosed within a lid in step 242.

Figure 24:
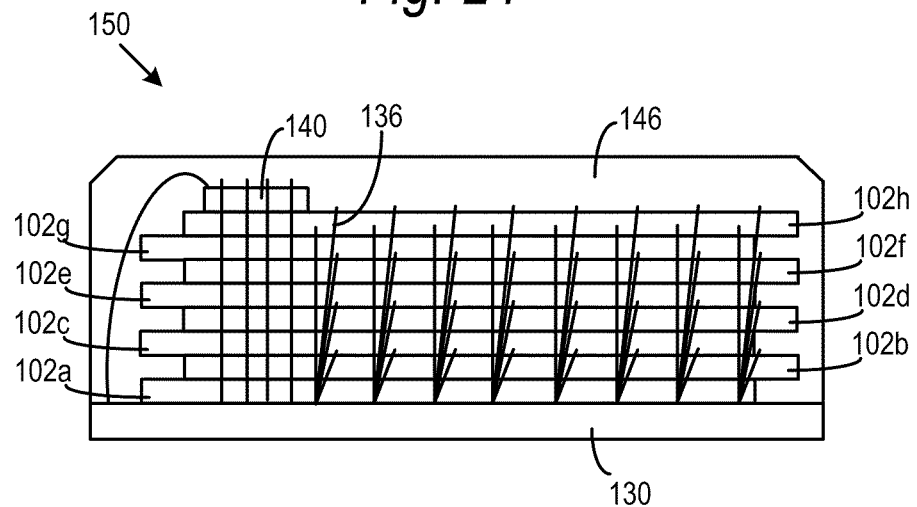
FIG. 24 is a cross-sectional view of a completed semiconductor device according to an alternative embodiment of the present technology.

As indicated above, package 150 may include differing number of die in the die stack. FIG. 24 shows a further embodiment of the present system where package 150 includes eight memory die 102a through 102h in the die stack. As described above, the die 102a through 102h may be mounted in the alternating stacked offset configuration so that the offset between each pair of die does not compound across all die in the stack. This results in a large die stack with a small footprint on the substrate 130.

In embodiments, the semiconductor die 102 may be one or more flash memory chips so that, with controller die 140, the package 150 may be used as a flash memory device. It is understood that the package 150 may include semiconductor die configured to perform other functions in further embodiments of the present system. The package 150 may be used in a plurality of standard memory cards, including without limitation a CompactFlash card, a SmartMedia card, a Memory Stick, a Secure Digital card, a miniSD card, a microSD card, a USB memory card and others.

In embodiments, the present technology relates to a semiconductor die, including: an edge formed with a plurality of corrugations, a corrugation including a protrusion extending from the edge; and a plurality of die bond pads along the edge of the semiconductor die, a die bond pad of the plurality of die bond pads provided in the protrusion.

In further embodiments, the present technology relates to a semiconductor package, including: a substrate; a first semiconductor die mounted on the substrate, the first semiconductor die including a first set of die bond pads along a first edge of the semiconductor die; and a second semiconductor die mounted on the first semiconductor die, the second semiconductor die including a plurality of corrugations defined by a plurality of protrusions and a plurality of recesses between the protrusions, the second semiconductor die mounted on the first semiconductor die with the first set of die bond pads on the first edge of the first semiconductor die exposed within the recesses of the second semiconductor die.

In still further embodiments, the present technology relates to a method of fabricating a semiconductor package. The method includes the steps of: (a) forming a first set of semiconductor die with die bond pads and corrugations along a first edge, the corrugations defined by protrusions and recesses between the protrusions; (b) forming a second set of semiconductor die with die bond pads and corrugations along a second edge, the corrugations defined by protrusions and recesses between the protrusions; and (c) stacking the first and second semiconductor die interspersed with each other on a substrate with the die bond pads of the first set of semiconductor die aligned within recesses of the second set of semiconductor die, and with the die bond pads of the second set of semiconductor die aligned within recesses of the first set of semiconductor die.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A semiconductor die, comprising:
    an edge formed with a plurality of corrugations, a corrugation including a protrusion extending from the edge and notches on either side of the protrusion, the notches extending through a full thickness of the semiconductor die; and
    a plurality of die bond pads along the edge of the semiconductor die, a die bond pad of the plurality of die bond pads provided in the protrusion.

2. The semiconductor die of claim 1, wherein the semiconductor die is a flash memory semiconductor die.

3. The semiconductor die of claim 1, wherein the semiconductor die is a NAND semiconductor die.

4. The semiconductor die of claim 1, wherein the edge formed with the plurality of corrugations is a first edge, the semiconductor die including a second edge opposed to the first edge, the second edge including a second plurality of corrugations including a recess.

5. The semiconductor die of claim 4, wherein a size and shape of the recess in the second edge matches a size and shape of the protrusion in the first edge.

6. The semiconductor die of claim 4, wherein the second edge further includes a protrusion, the protrusion in the second edge including a die bond pad.

7. The semiconductor die of claim 1, wherein the corrugation is defined by three orthogonal edges.

8. The semiconductor die of claim 1, wherein the corrugation is defined by lased edges.

9. A semiconductor package, comprising:
a substrate;
a first semiconductor die mounted on the substrate, the first semiconductor die including a first set of die bond pads along a first edge of the semiconductor die; and
a second semiconductor die mounted on the first semiconductor die, the second semiconductor die including a plurality of corrugations defined by a plurality of protrusions and a plurality of recesses between the protrusions, the second semiconductor die mounted on the first semiconductor die with the first set of die bond pads on the first edge of the first semiconductor die exposed within the recesses of the second semiconductor die.

10. The semiconductor package of claim 9, the second semiconductor die including a second set of die bond pads, the second set of die bond pads positioned on the plurality of protrusions of the plurality of corrugations.

11. The semiconductor package of claim 9, a reference axis being defined parallel to the first edge of the first semiconductor die, the second semiconductor die mounted to the first semiconductor die staggered along the reference axis with respect to the first semiconductor die.

12. The semiconductor package of claim 11, wherein the first and second semiconductor die are aligned along an axis orthogonal to the reference axis.

13. The semiconductor package of claim 9, further comprising a first set of wire bonds having first ends connected to the first set of die bond pads on the first semiconductor die within the recesses of the second semiconductor die and second ends connected to the substrate.

14. The semiconductor package of claim 13, further comprising a second set of wire bonds having first ends connected to the second set of die bond pads on the second semiconductor die and second ends connected to the substrate.

15. The semiconductor package of claim 14, wherein at least one of the first and second wire bonds are electrically insulated.

16. The semiconductor package of claim 14, further comprising a controller die.

17. The semiconductor package of claim 16, further comprising molding compound for encapsulating the first and second semiconductor die and first and second sets of wire bonds.

18. The semiconductor package of claim 9, wherein the first semiconductor die further includes a third edge opposite the first edge, and the second semiconductor die further includes a fourth edge opposite the second edge, the third and fourth edges including die bond pads, the fourth edge of the second semiconductor die including a plurality of corrugations having protrusions and recesses, the bond pads on the third edge of the first semiconductor die aligning within the recess of the fourth edge of the second semiconductor die when the second semiconductor die is mounted on the first semiconductor die.

19. The semiconductor package of claim 18, wherein the bond pads at the fourth edge of the second semiconductor die are formed in the protrusions in the corrugations of the fourth edge of the second semiconductor die.

20. The semiconductor package of claim 9, the package comprising one of a CompactFlash card, a SmartMedia card, a Memory Stick, a Secure Digital card, a miniSD card, a microSD card, a USB memory card.

21. A semiconductor package, comprising:
a substrate;
a first semiconductor die mounted on the substrate, the first semiconductor die including a first set of die bond pads along a first edge of the semiconductor die, the first edge defining a reference axis;
a second semiconductor die mounted on the first semiconductor die, the second semiconductor die including a second edge having a second set of die bond pads and a first plurality of corrugations defined by a first plurality of protrusions and a first plurality of recesses between the first plurality of protrusions, the second semiconductor die mounted on the first semiconductor die offset in a first direction along the reference axis an amount so that the first set of die bond pads on the first edge of the first semiconductor die are exposed within the first plurality of recesses of the second semiconductor die; and
a third semiconductor die mounted on the second semiconductor die, the third semiconductor die including a third edge having a second plurality of corrugations defined by a second plurality of protrusions and a second plurality of recesses between the second plurality of protrusions, the third semiconductor die mounted on the second semiconductor die offset in a second direction along the reference axis, the second direction opposite the first direction, the third semiconductor die offset in the second direction an amount so that the second set of die bond pads on the second edge of the second semiconductor die are exposed within the second plurality of recesses of the third semiconductor die.

22. The semiconductor package of claim 21, wherein the first, second and third semiconductor die are aligned with each other along an axis orthogonal to the reference axis.

23. The semiconductor package of claim 21, wherein the first and third semiconductor die are aligned with each other along both the reference axis and an axis orthogonal to the reference axis.

24. The semiconductor package of claim 21, further including a third set of die bond pads in the third edge of the third semiconductor die, the third set of die bond pads formed in the protrusions of the third edge.

25. The semiconductor package of claim 24, wherein the first, second and third sets of die bond pads are electrically coupled to the substrate.

26. A semiconductor package, comprising:
a substrate;
a first semiconductor die mounted on the substrate, the first semiconductor die including a first set of die bond pads along a first edge of the semiconductor die, a reference axis being defined along the first edge;
a second semiconductor die mounted on the first semiconductor die, the second semiconductor die including a second edge having a second set of die bond pads and a plurality of corrugations defined by a plurality of protrusions and a plurality of recesses between the protrusions, the second semiconductor die mounted on the first semiconductor die offset in a first direction along the reference axis an amount so that the first set of die bond pads on the first edge of the first semiconductor die are exposed within the first plurality of recesses of the second semiconductor die; and a plurality of additional semiconductor die including odd semiconductor die interspersed with even semiconductor die and one of the odd semiconductor die mounted on the second semiconductor die, the plurality of additional semiconductor die each including an edge having die bond pads and a plurality of corrugations defined by a plurality of protrusions and a plurality of recesses between the protrusions, the die bond pads in the even semiconductor die aligning within the recesses of the odd semiconductor die mounted thereabove, and the die bond pads in the odd semiconductor die aligning within the recesses of the even semiconductor die mounted thereabove.

27. The semiconductor package of claim 26, wherein the first semiconductor die, the second semiconductor die and the plurality of additional semiconductor die are aligned with each other along an axis orthogonal to the reference axis.

28. The semiconductor package of claim 26, wherein the first semiconductor die and the odd semiconductor die are aligned with each other along both the reference axis and an axis orthogonal to the reference axis.

29. The semiconductor package of claim 28, wherein the second semiconductor die and the even semiconductor die are aligned with each other along both the reference axis and the axis orthogonal to the reference axis.

30. A method of fabricating a semiconductor package, comprising the steps of:
   (a) forming a first set of semiconductor die with die bond pads and corrugations along a first edge, the corrugations defined by protrusions and recesses between the protrusions;
   (b) forming a second set of semiconductor die with die bond pads and corrugations along a second edge, the corrugations defined by protrusions and recesses between the protrusions; and
   (c) stacking the first and second semiconductor die interspersed with each other on a substrate with the die bond pads of the first set of semiconductor die aligned within recesses of the second set of semiconductor die, and with the die bond pads of the second set of semiconductor die aligned within recesses of the first set of semiconductor die.

31. The method of claim 30, said step (c) comprising the step of offsetting the second set of semiconductor die with respect to the first set of semiconductor die.

32. The method of claim 31, said step (c) comprising the step of aligning the first and second sets of semiconductor die with each other along a first axis.

33. The method of claim 31, said step (c) comprising the step of aligning the first set of semiconductor die with each other along first and second orthogonal axes.

34. The method of claim 33, said step (c) comprising the step of aligning the second set of semiconductor die with each other along the first and second orthogonal axes.

* * * * *